(12) United States Patent
Peng et al.

(10) Patent No.: US 7,884,345 B2
(45) Date of Patent: Feb. 8, 2011

(54) PHASE-CHANGE MATERIAL, MEMORY UNIT AND METHOD FOR ELECTRICALLY STORING/READING DATA

(75) Inventors: Lung-Han Peng, Taipei (TW); Sung-Li Wang, Taipei (TW); Meng-Kuei Hsieh, Taipei (TW); Chien-Yu Chen, Taipei (TW)

(73) Assignee: National Taiwan University, Taipei (TW)

(*) Notice: Subject to any disclaimer, the term of this patent is extended or adjusted under 35 U.S.C. 154(b) by 266 days.

(21) Appl. No.: 12/182,644

(22) Filed: Jul. 30, 2008

(65) Prior Publication Data

US 2009/0185412 A1    Jul. 23, 2009

(30) Foreign Application Priority Data

Jan. 18, 2008    (TW) .............................. 97101865 A

(51) Int. Cl.
*H01L 29/04* (2006.01)

(52) U.S. Cl. .................... 257/3; 257/2; 257/5; 257/734; 257/E31.029; 365/100; 365/113; 365/148; 365/185.03; 438/381; 438/455; 438/469; 438/900

(58) Field of Classification Search ................. 257/1–5, 257/295, 296, 734, E31.029; 365/100, 103, 365/113, 130, 148, 163, 185.03, 185.2; 438/381, 438/455, 469, 900

See application file for complete search history.

(56) References Cited

U.S. PATENT DOCUMENTS

2008/0017842 A1* 1/2008 Happ et al. ..................... 257/4
2009/0078924 A1* 3/2009 Liang et al. .................... 257/3

* cited by examiner

*Primary Examiner*—Evan Pert
*Assistant Examiner*—Scott Wilson

(57) ABSTRACT

A phase-change material and a memory unit using the phase-change material are provided. The phase-change material is in a single crystalline state and includes a compound of a metal oxide or nitroxide, wherein the metal is at least one selected from a group consisting of indium, gallium and germanium. The memory unit includes a substrate; at least a first contact electrode formed on the substrate; a dielectric layer disposed on the substrate and formed with an opening for a layer of the phase-change material to be formed therein; and at least a second contact electrode disposed on the dielectric layer. As the phase-change material is in a single crystalline state and of a great discrepancy between high and low resistance states, the memory unit using the phase-changed material can achieve a phase-change characteristic rapidly by pulse voltage and avert any incomplete reset while with a low critical power.

20 Claims, 9 Drawing Sheets

PHASE-CHANGE MATERIAL, MEMORY UNIT AND METHOD FOR ELECTRICALLY STORING/READING DATA

FIELD OF THE INVENTION

The present invention relates to a phase-change material and memory units, and more particularly, to a phase-change material and a memory unit using the same, which are capable of storing/reading data in an electric manner.

BACKGROUND OF THE INVENTION

In the field of optical storage, it has been an important and well-developed technology to record digital signals of 0 and 1 generated by the change of refractive index of a phase-change material in different crystalline states, for example, an optical recording layer of an optical disk (CD, DVD). In 1986, investigators of International Business Machines Corporation (IBM) found that a phase-change alloy of germanium-stibium-tellurium (Ge—Sb—Te, GST) converts rapidly in phase by means of the transfer of electrical signals, making this phase-change material be extensively applied to a flash memory that can be operated to transfer electronic signals.

Along with the rapid growth of and increasing demand for information, it is desired to store information in a faster way and for a longer period. The memory feature of non-volatile phase-change memories mainly comes from a resistance change generated by a reversible transition of different phases between a non-conducting and a conducting state of the material. For example, an irregular semiconductor alloy of chalcogenide having Ge, Se and Te in an amorphous state can be transformed from an alloy in a chaotically amorphous state into a conductor in a well-crystallized state within dozens of nano-seconds by applying adequate electrical power or light power. Compared with conventional flash memories, such a phase-change memory has the advantages, such as shorter time for random access, higher processing ability for reading and writing, and more times of rewriting. In addition, the process thereof is simple and has high potential to produce a small-volume memory unit having high density and high capacity. It thus allows the phase-change material to be capable of meeting the oncoming 45-nanometer requirement for fabricating flash memories.

The phase-change memory utilizes the transition between thermal energy and potential energy to form two distinguishably stable states. In the past, the resistance in a memory unit of a phase-change memory (PRAM) was relatively low, for instance, just several thousand ohms, and the current of the unit had a high loss owing to the resistance of a transistor. In 2005 International Electron Devices Meeting (IEDM), Hitachi published a storage unit that is characterized by adding oxygen atoms in the GST film. After combing with germanium atoms, the added oxygen atoms disperse evenly in the GST film so that the film is in a state of small particle size and multi-crystal, thereby increasing the resistance value of the memory unit. The resistance is increased to 50 kΩ, so as to transform most energy of the current in the storage unit into thermal energy required for phase change, thereby increasing the phase-change efficiency and reducing the power consumption while writing. Such storage unit is fabricated by using 0.13-micrometer process technology, and the voltage/current required for data writing can be reduced to 1.5 V/100 μA, so as to meet the practical requirement of about 150 μW of phase-change power. However, the method of increasing the resistance by adding impurities, such as oxygen atoms and nitrogen atoms, in the GST film increases variation of characteristic due to a deviation of the addition amount of impurities in different units. Therefore, it is difficult to control the characteristics of the above storage unit.

Additionally, in 2006 International Electron Devices Meeting (IEDM), the technology of decreasing writing current without the addition of impurities was published. Such technology is to dispose a layer of $Ta_2O_5$ film having a heat-insulating effect between the GST film and the bottom electrode, so as to change the crystalline state of the GST film in low-current condition, and simultaneously, to increase the adhesion between the GST film and the bottom electrode by means of the $Ta_2O_5$ film.

However, with respect to the GST, the resetting process is subject to be interfered because of the material having two crystalline states, so that the resistance value of the reset amorphous state is not high enough and an incomplete reset may easily occur. Therefore, it is desired to have a phase-change material and a phase-change storage unit that can not only rapidly achieve the phase-change characteristic in low critical power condition, but also have a great discrepancy between high and low resistance states and avoid an incomplete reset.

SUMMARY OF THE INVENTION

To achieve the objective and others, the present invention provides a phase-change material and a phase-change memory unit. The phase-change material including a compound of a metal oxide or a metal nitroxide as a main component, wherein the metal is at least one selected from the group consisting of oxide or nitroxide of indium, gallium and germanium, and wherein the phase-change material is in a single crystalline state. The phase-change material can be used to fabricate the memory unit, which includes a substrate; a first contact electrode formed on the substrate; a dielectric layer disposed on the substrate and formed with an opening, wherein a layer of the phase-change material is formed in the opening; and a second contact electrode disposed on the dielectric layer; wherein the phase-change material is in a single crystalline state, and the layer of the phase-change material is electrically connected to the first contact electrode and the second contact electrode, respectively.

In another aspect, the present invention also provides a method for electrically storing/reading data. For example, a voltage with pulse width between 10 to 150 ns and with pulse amplitude between 0 and 15 volt is used, so as to facilitate the phase-change memory unit to rapidly achieve a phase-change characteristic for storing/reading data in the memory unit.

The phase-change material of this invention is in a single crystalline state and has a characteristic of a great discrepancy between high and low resistance states, so that while being used to fabricate the phase-change memory unit, it can rapidly achieve a phase-change characteristic by means of pulse voltage in a low critical power condition, thereby avoiding incomplete reset and also being applicable to be integrated into a silicon-based semiconductor process.

DETAILED DESCRIPTIONS OF THE PREFERRED EMBODIMENTS

Figure 1:
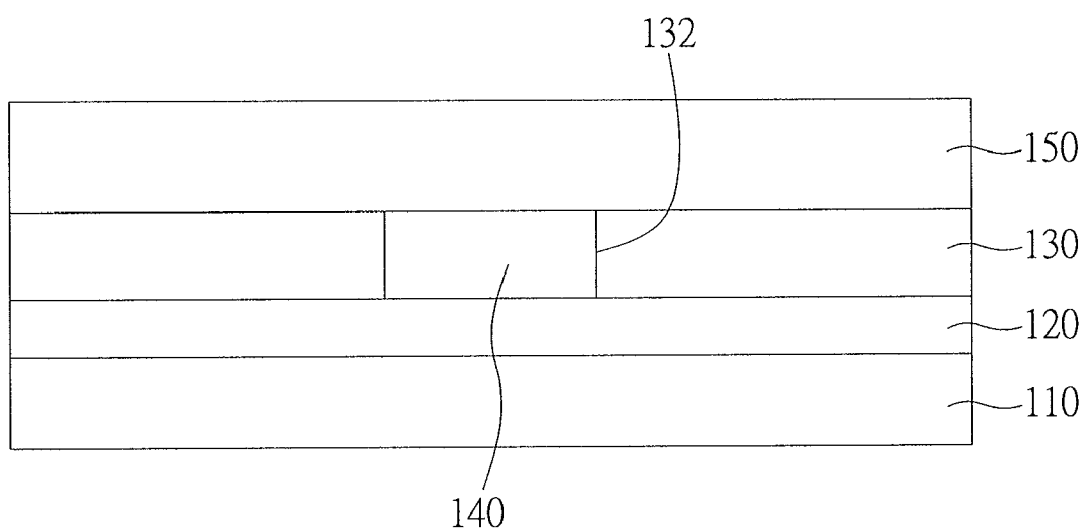
FIG. 1 is a structure of a memory unit fabricated by the phase-change material of this invention.

The embodiments of the present invention are explicitly described according to the specific embodiments in the following description.

The main component included in the phase-change material of this invention may comprise In—O, Ga—O, Ge—O, In—Ga—O, In—Ge—O, Ga—Ge—O, In—Ga—Ge—O, In—O—N, Ga—O—N, Ge—O—N, In—Ga—O—N, In—Ge—O—N, Ga—Ge—O—N or In—Ga—Ge—O—N. Preferably, the phase-change material may comprise In—O—N, Ga—O—N, Ge—O—N, In—Ga—O—N or In—Ga—Ge—O—N. More preferably, the material may comprise In—O—N, In—Ga—O—N or In—Ga—Ge—O—N. An element ratio of the main component of the phase-change material is represented by Formula (I):

$$In_aGa_bGe_cO_dN_{1-(a+b+c+d)} \quad (I)$$

in which a, b, c and d each represents a percentage of atomic number of each element; and $0 \leq a < 1$;
$0 \leq b < 0.2$;
$0 \leq c < 0.4$;
$0 < d < 1$; and wherein at least one of a, b and c is not 0 and $a+b+c+d \leq 1$.

The phase-change material of this invention can be in a form of thin film, which is formed, for example, by means of vapor deposition and sputtering deposition. In one embodiment, the phase-change thin film is formed by thermal evaporation. Different element ratios of the phase-change material can be acquired according to the selected evaporation substrate and the adjustment of the input of oxygen and nitrogen. For example, the phase-change thin film with $0.15 < a < 0.65$ and $0.25 < d < 0.95$ is formed.

In the phase-change material having indium and oxygen, the ratio of indium atoms is typically ranging from 35% to 90%. While the ratio of indium atoms is lower than 35%, the fabricated unit almost has no phase-change characteristic. While the ratio of indium atoms to oxygen atoms approximates to 2:3 and nitrogen atoms are included in the material ($b=0, c=0, a:d=2:3$ and $a+b+c+d \neq 1$), the fabricated unit has a longer lifetime.

In another embodiment, the thin film of germanium or gallium oxide/nitroxide can Also be used as the phase-change material, such as a phase-change thin film of germanium oxide in which $a=0, b=0$ and $a+b+c+d=1$; a phase-change thin film of germanium nitroxide in which $a=0, b=0$ and $a+b+c+d \neq 1$; a phase-change thin film of gallium oxide in which $a=0, c=0$ and $a+b+c+d=1$; or a phase-change thin film of gallium nitroxide in which $a=0, c=0$ and $a+b+c+d \neq 1$.

The conventional phase-change alloy of germanium-stibium-tellurium (Ge—Sb—Te, GST) is successively crystallized to form a face-centered cubic (fcc) and a hexagonal close-packed crystal (hcp) at 150° C. and 290° C. Due to the two crystalline states of the GST phase-change alloy, namely a transitional face-centered cubic state existing between an amorphous state and a hexagonal close-packed state, it is easy to be interfered with the transitional face-centered cubic state while resetting. As a result, in the prior art, the resistance of the amorphous state is not high enough after resetting. In contrast, the phase-change material of this invention simply has two steady states, that is, a single crystalline state and an amorphous state. For example, the amorphous state of In—Ga—O—N thin film changes phases for one time and is crystallized to form a bixbyite cubic state at temperature between 275 and 290° C. in this invention. While applying a pulse voltage to provide energy (thermal energy) for phase change, the phase-change material of the present invention not only has a characteristic of a great discrepancy between high and low resistance states, but also averts an incomplete reset, so as to be applicable to an electrical memory device.

In addition, in order to improve the characteristic of the material, Group IV elements can also be added into the phase-change material of this invention, such as C, Si, Ge, Sn or Pb. Si is preferable. The phase-change material of this invention added with Si improves the resistance value of the material, so as to decrease the resetting current without altering the critical power, thereby being advantageous to fabricate the memory unit with high-density. Furthermore, based on the result of electron diffraction, the area added with Si element shows stronger electron diffraction and facilitates the phase-change material to be in a crystalline state.

FIG. 1 shows a memory unit fabricated by the phase-change material in an embodiment of this invention. In this embodiment, the phase-change memory unit 100 comprises a substrate 110, a first contact electrode 120, a dielectric layer 130, a layer of the phase-change material 140 and a second contact electrode 150.

The phase-change memory unit of this invention can be incorporated with the silicon-based semiconductor process so that an integrated circuit board can be used as the substrate 110. The first contact electrode 120 is formed on the circuit board (for example, using the substrate of heating pillar under the 0.18-micrometer process as a bottom substrate of the memory unit), and then energy (thermal energy) generated by pulse voltage enables the material to achieve the phase-change transition. The first contact electrode 120 may comprise, but not limited to, Ti/Ni, Au, TiN, TiAlN or alloy of Ti and W. The dielectric layer 130 is disposed on the first contact electrode 120, and may comprise $SiO_2$, SiO, $Ga_2O_3$, GaOOH, $Ts_2O_5$ or $TiO_2$. Preferably, The dielectric layer 130 includes $SiO_2$ or $Ga_2O_3$. The dielectric layer 130 has an opening 132, a layer of the phase-change material 140 is disposed in the opening 132 and electrically connected to the first contact electrode 120.

With respect to the same phase-change material, energy (thermal energy) required for raising temperature to a specific degree is in direct proportion to the mass of the material. In the condition of a fixed contact area, the critical power for phase change increases along with the thickness of the thin film. Therefore, the power required for phase change can be reduced by decreasing the thickness of the layer of the phase-change material, so as to further increase the density of the memory unit and to improve the memory capacity. However, while the thickness of the layer of the phase-change material is decreased to a certain extent, there may be no phase change that could be observed. In the phase-change memory unit of this invention, the layer of the phase-change material has a thickness of 5 to 100 nm, preferably 20 to 80 nm. Further, with respect to the same thickness of the material, there is a positive correlation between the critical current and the contact area. The contact area between the layer of the phase-change material and the first contact electrode in the phase-change memory unit of this invention is between 0.0003 and 100 µm², preferably between 0.02 and 2.5 µm², and more preferably between 0.02 and 0.5 µm². When the process is performed to a narrower line width, the smaller contact area should result in the better characteristic performance.

In addition, nano-electron beam lithography process is performed to form an opening 132 on the dielectric layer 130, and the opening can be a small hole of, for example, 22 to 180 nm, preferably 80 to 120 nm, and more preferably 100 nm, provided for the phase-change material to be disposed therein. Moreover, a heating pillar made of tungsten metal can also be used to fill in the opening 132 of the dielectric layer as a high-resistance heating electrode to form a structure of small-hole heating pillar. The heating effect can be greatly improved by using the small-hole structure and the structure of small-hole heating pillar. With respect to the phase-change material of In—Ga—N—O, the critical power can be decreased from 4.6 mW to less than 18 µW, so as to save energy and reduce unnecessary waste. In addition, less residual heat is produced, so as to improve the lifetime of the unit. Furthermore, due to the decreased driving voltage and current, the line width of the driving transistor required for the memory unit is reduced. As a result, the size of the unit is reduced so as to further meet the requirement for the memory with high capacity.

In the phase-change memory unit of this invention, the second contact electrode 150 is disposed on the dielectric layer 130 and is used to cover the layer of the phase-change material 140. The second contact electrode 150 may comprise, but not limited to, Ti/Ni, Au, TiN, TiAlN, Ti/Au, Al/Au or alloy of Ti and W. Preferably, metals with high thermal conductivity, such as Ti/Au or Al/Au, are used as the second contact electrode. The second contact electrode can be used to cover the top of the layer of the phase-change material by means of a metal-adhesive layer so that the heat dissipation effect of the phase-change material can be improved via the metal with high thermal conductivity, thereby accelerating the cooling speed and further improving the resistance value at high resistance state.

The present invention also provides a method for electrically storing/reading data by means of the memory unit having the phase-change material of this invention. By applying a voltage with a pulse width between 10 to 150 ns, preferably between 20 and 80 ns, and with a pulse amplitude between 0 to 15 volt, preferably between 0 to 12 volt, the layer of the phase-change material in the memory unit utilizes the difference of resistance value between two steady states, namely the amorphous state and the body-centered cubic crystalline state, for storing/reading data. The method of this invention can reduce the pulse width of voltage used for storing/reading data in the phase-change memory unit so as to accelerate the cooling speed in the process of resetting and to improve the resistance value at high resistance state.

The present invention is further described according to the following embodiments, and it shall not be explained in any form to limit the content or scope of this invention.

EXAMPLES

Preparative Example

One silica glass substrate of 1 cm² processed with basic cleaning steps is ready for use. The indium oxide powder of 99.999% in purity and the gallium oxide powder of 99.999% in purity (Aldrich Chemical Co.) are loaded respectively in a capped tantalum boat smeared with aluminum oxide to form a substrate for vapor deposition process, and the substrate is then placed into an evaporation chamber and is processed by means of a mechanical pump and a turbo pump as the bottom pressure reaches $5 \times 10^{-6}$ torr. In the vapor deposition process, oxygen and nitrogen are continuously inletted at the amount of 20 standard cubic centimeter per minute (20 sscm), and the pressure inside the chamber is controlled at $8 \times 10^{-3}$ torr by means of a throttle valve. The temperature is maintained below 80° C., and the evaporation rate is maintained between 0.9 and 1.2 nm/sec so that the In—Ga—N—O thin film in an amorphous state is obtained.

The phase-change material thin film is heat-baked, and then the resistivity of the thin film is measured at the baking conditions of different temperatures by means of the circular transmission line method. At the temperature point with a dropped resistance, an X-ray diffractometer is used to detect the crystalline state of the thin film. The temperature points at which a lattice structure starts to appear are found out, and the exothermic peak corresponding to the crystallization temperature is further found out by means of the differential scanning calorimetry. The surface appearance of the thin film is detected by the graph of the scanning electron microscope, and it is verified that the phase-change temperature ranges from 275 to 290° C.

Figure 2:
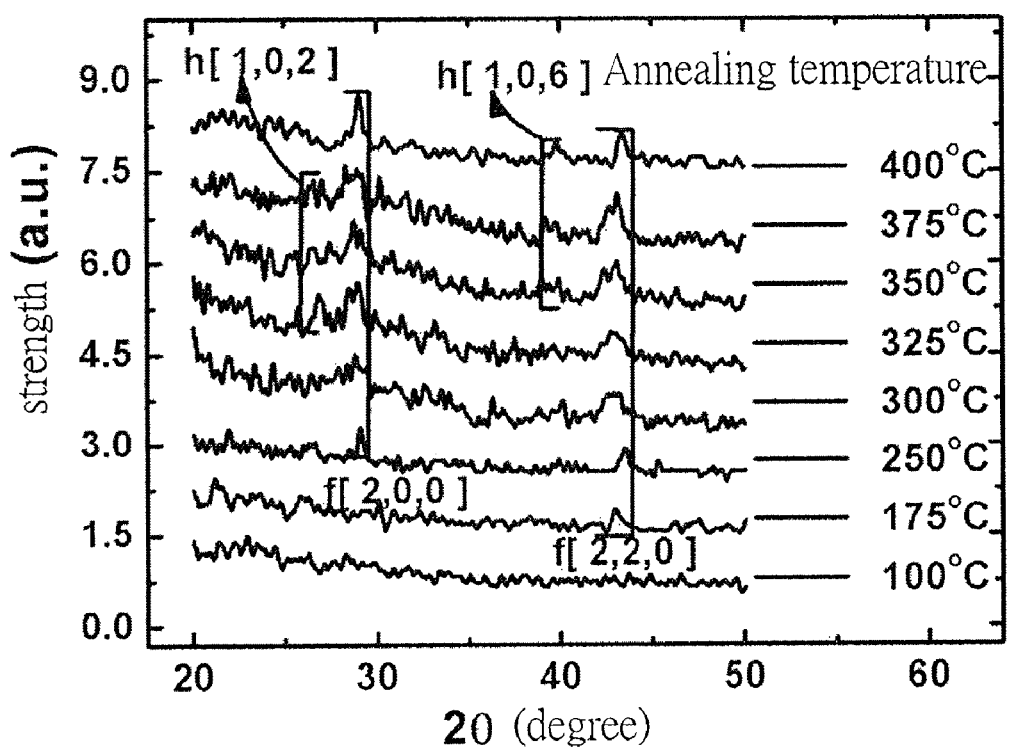
FIG. 2 is an X-ray diffraction pattern showing the temperature effect of $Ge_2Sb_2Te_5$ thin film in comparative example 1.

The phase-change material of $Ge_2Sb_2Te_5$ is formed on a silicon wafer by sputter deposition, and then the phase-change thin film of $Ge_2Sb_2Te_5$ is measured and analyzed by X-ray diffraction. FIG. 2 is an X-ray diffraction pattern showing the temperature effect. While the temperature is higher than 175° C., signals of face-centered cubic lattice plane, fcc, [220] appears, and while the temperature is higher than 325° C., signals of hexagonal close-packed, hcp [102] and hcp [106], appear gradually. While the temperature reaches 400° C., the strength of whole diffraction decreases significantly. It is shown in these results that the phase-change material of $Ge_2Sb_2Te_5$ has two crystalline states.

Figure 3:
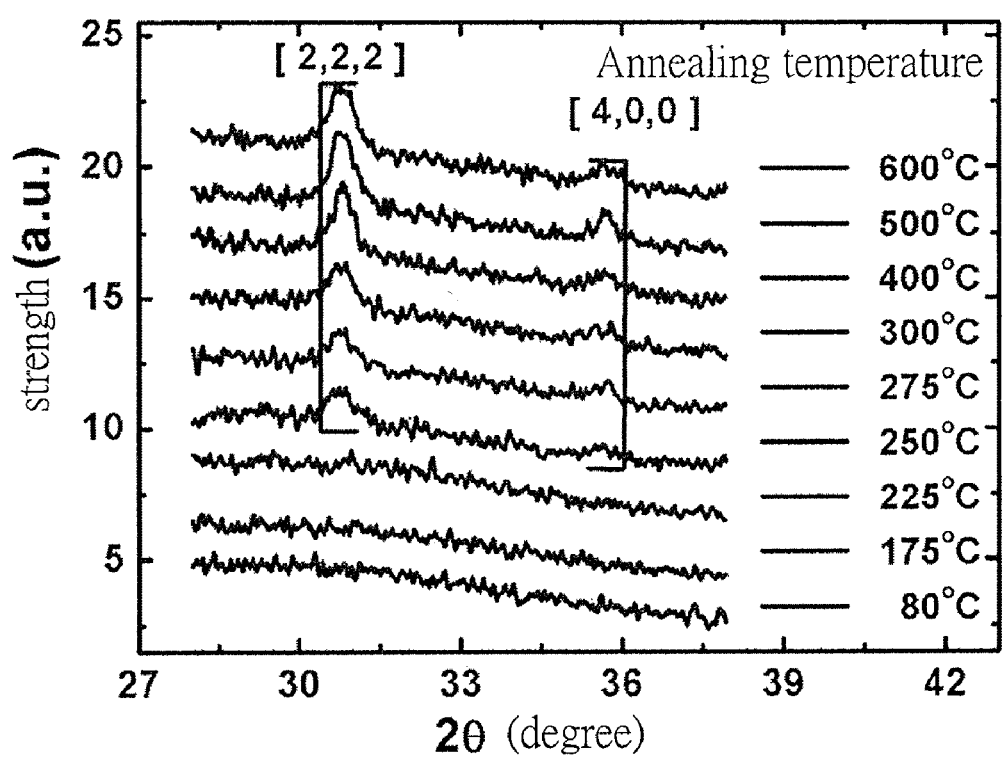
FIG. 3 is an X-ray diffraction pattern showing the temperature effect of InGaON thin film in example 1.

The phase-change material of InGaON is formed on a silicon wafer by sputter deposition, and then the phase-change thin film of $Ge_2Sb_2Te_5$ is measured and analyzed by X-ray diffraction. FIG. 3 is an X-ray diffraction pattern showing the temperature effect. While the temperature is higher than 250° C., signals of the lattice plane at high peak [222] and short peak [400] appear. The tendency of peak strength increases gradually along with the rising of temperature, and there are more and more crystalline components. After the temperature reaches 500° C., the peak strength stops increasing. It is shown in these results that the phase-change material of the present invention has a single crystalline state.

Figure 4:
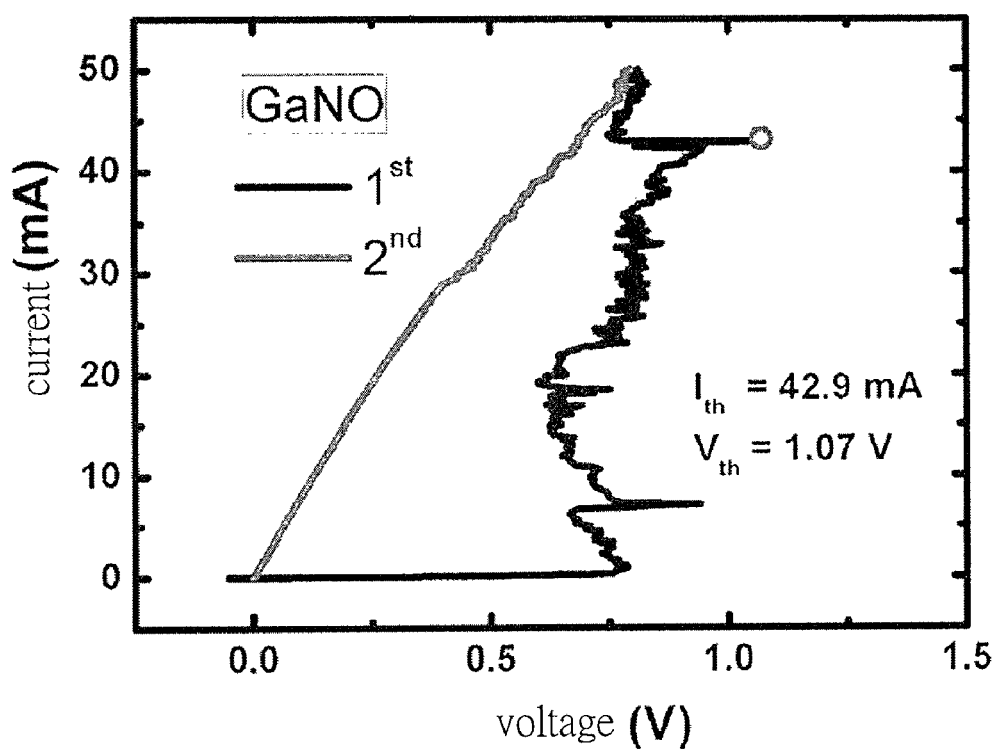
FIG. 4 is a current-voltage graph of the memory unit sample in example 2.

A 0.18-micrometer dielectric trench is formed on a metal wire layer of the integrated circuit, and filled with tungsten metal as a bottom substrate. The chamber pressure is controlled by a throttle valve in the vapor deposition process, and the adequate flow amount of oxygen and nitrogen is controlled by MFC. While the chamber pressure is at 8 mtorr, a layer of the phase-change material of Ga—O—N is formed on the bottom substrate and has a thickness of 20 µm. Then, a passivation structure of silicon dioxide and a metal cushion at the top are formed so as to obtain a memory unit sample. A current-voltage graph of the memory unit sample is illustrated in FIG. 4. The resistance at an amorphous state is 2 kΩ, and the resistance at a crystalline state is 160Ω. The critical current for phase change is 43 mA.

Example 3

A layer of the phase-change material of Ge—O—N is formed on the bottom substrate and has a thickness of 20 µm.

Figure 5:
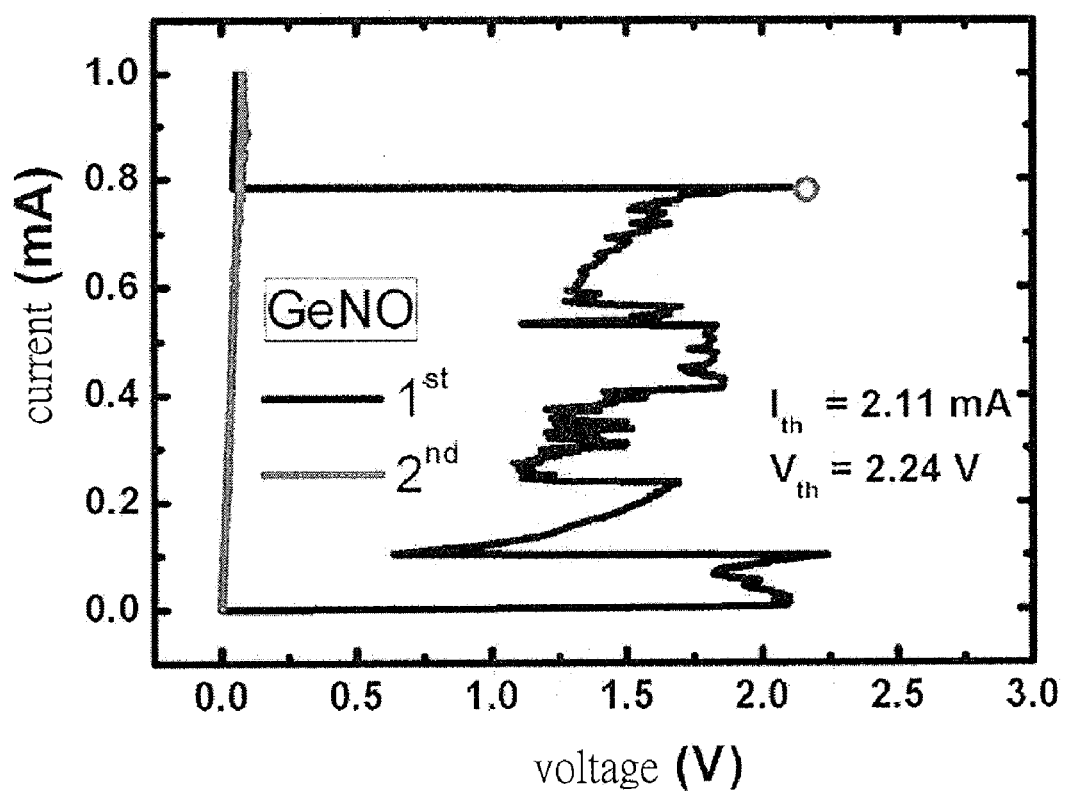
FIG. 5 is a current-voltage graph of the memory unit sample in example 3.

Then, a passivation structure of silicon dioxide and a metal cushion at the top are formed so as to obtain a memory unit sample. A current-voltage graph of the memory unit sample is illustrated in FIG. 5. The resistance at an amorphous state is 402 kΩ, and the resistance at a crystalline state is 80Ω. The critical current for phase change is about 2 mA.

Example 4

Figure 6:
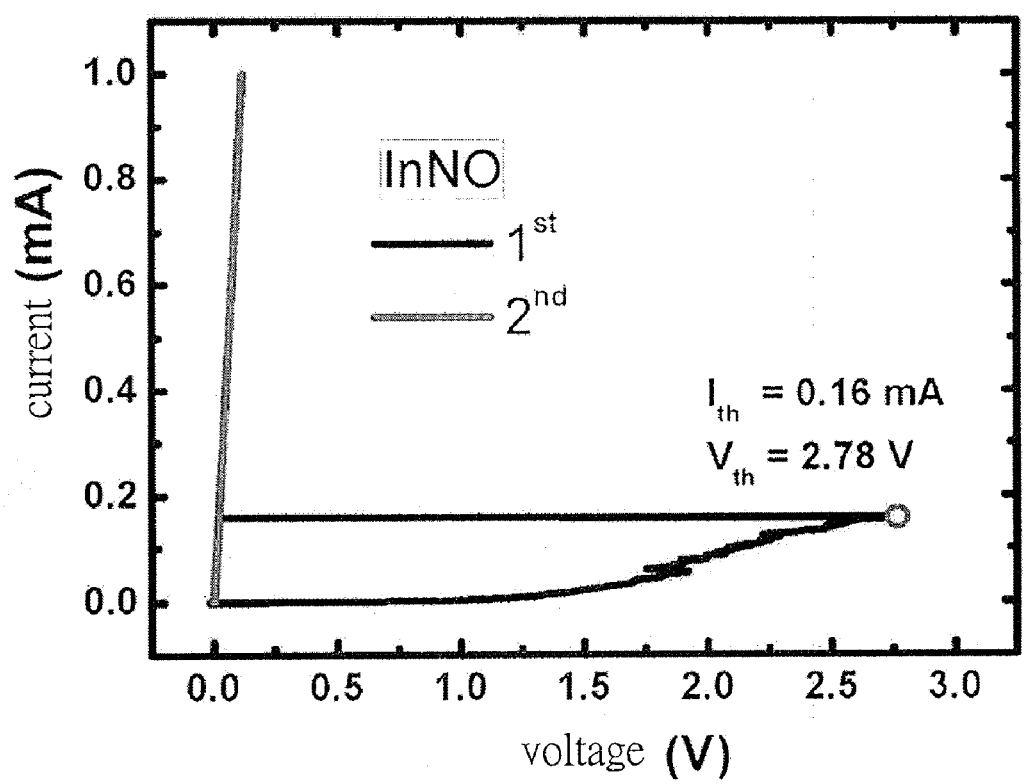
FIG. 6 is a current-voltage graph of the memory unit sample in example 4.

A layer of the phase-change material of In—O—N is formed on the bottom substrate and has a thickness of 20 μm. Then, a passivation structure of silicon dioxide and a metal cushion at the top are formed so as to obtain a memory unit sample. A current-voltage graph of the memory unit sample is illustrated in FIG. 6. The resistance at an amorphous state is 17 kΩ, and the resistance at a crystalline state is 115Ω. The critical current for phase change is 0.16 mA.

Example 5

Figure 7:
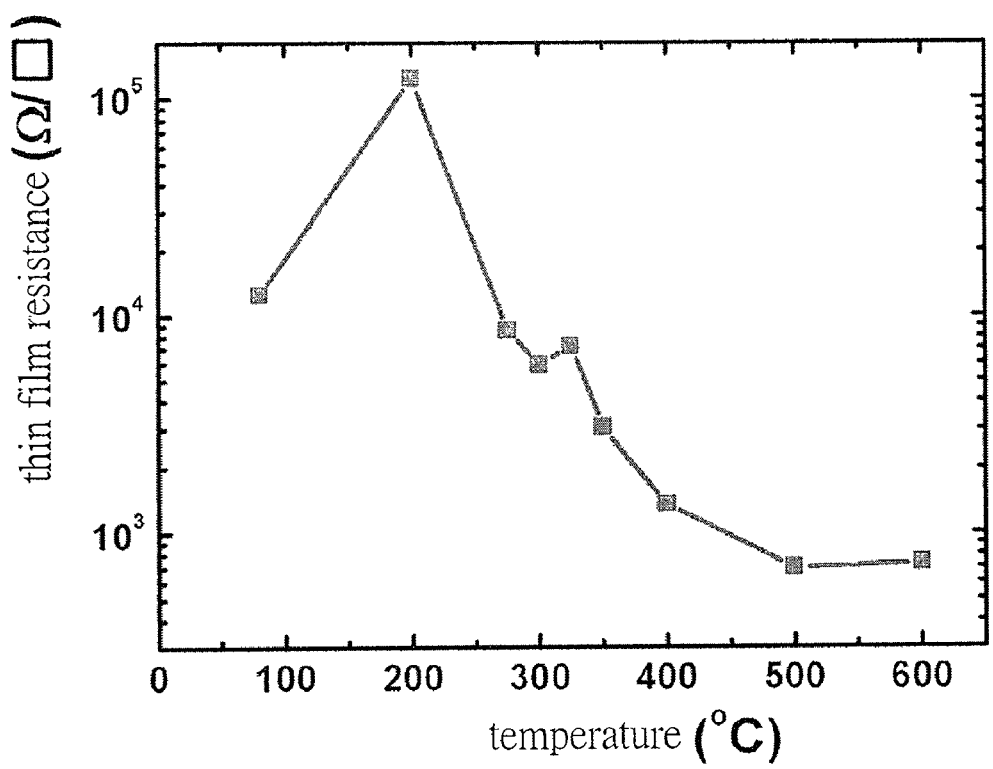
FIG. 7 is the thin film resistance of the phase-change material in example 5 at different temperature conditions.
Figure 8:
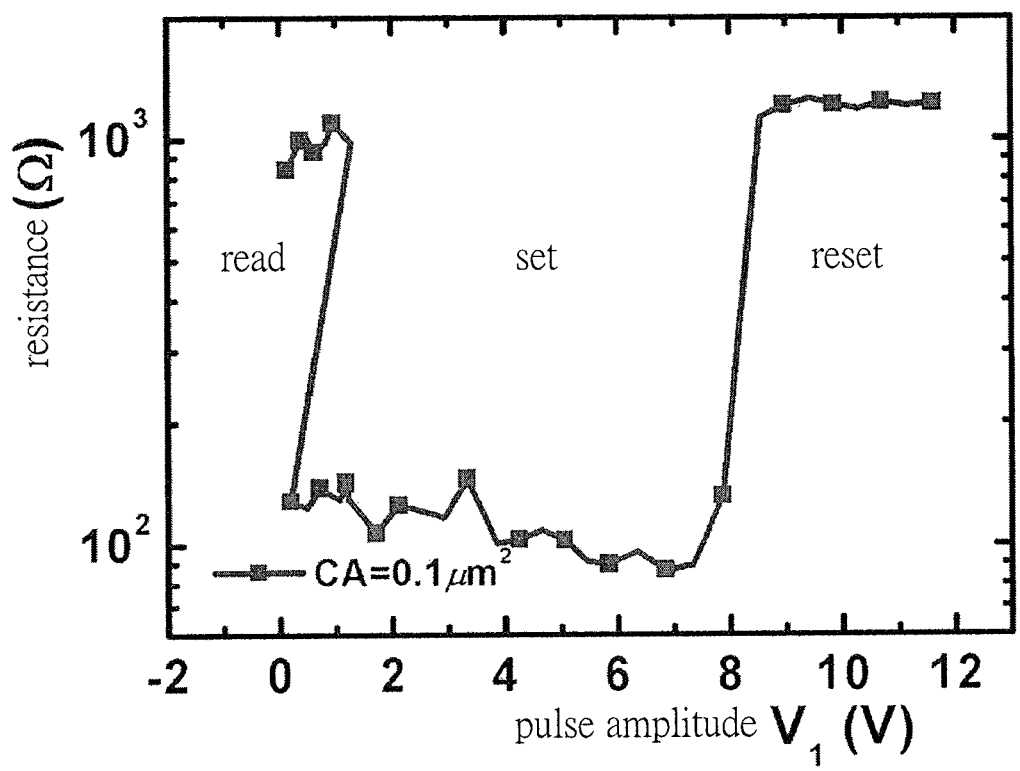
FIG. 8 is a V-R scanning result of the memory unit sample in example 5.
Figure 9:
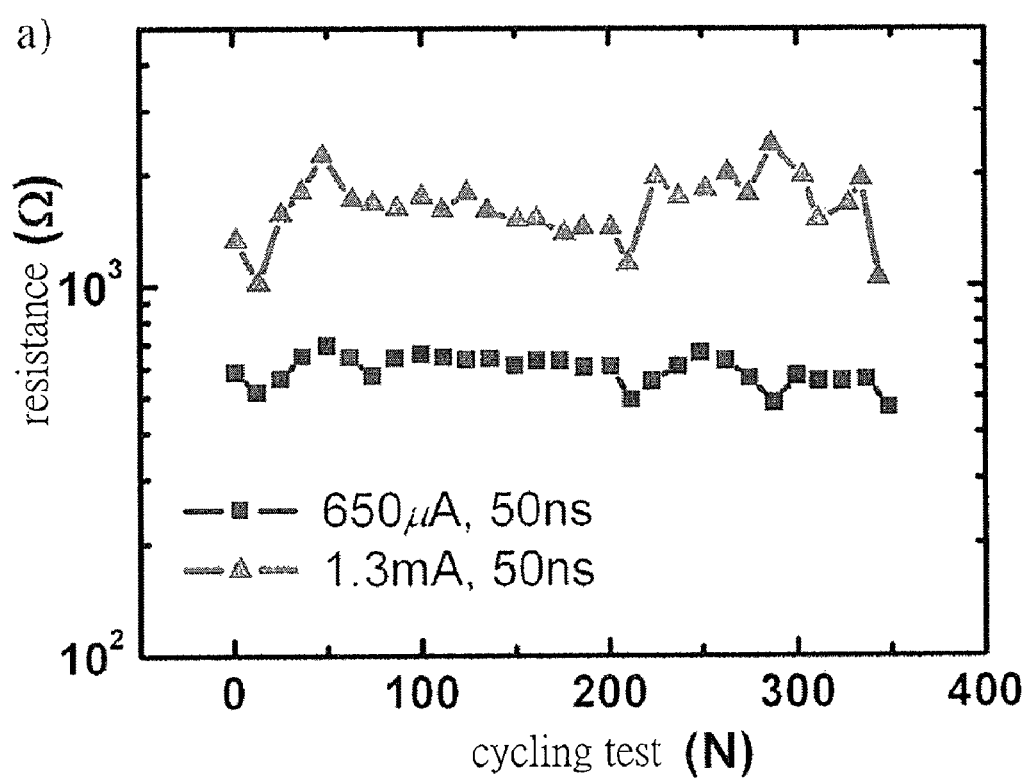
FIG. 9 is a cycling test result of the memory unit sample in example 5.

A thin film of the phase-change material of In—Ga—Ge—O—N is formed on the bottom substrate and has a thickness of 40 μm. The annealing temperature is changed, and then the resistance of the thin film is measured and illustrated in FIG. 7. While the temperature is about 275° C., the resistance of the thin film decreases by half, and while the temperature is higher than 500° C., the resistance of the thin film decreases to only one-eighth. Subsequently, the pulse width is fixed at 90 ns, and the pulse amplitude is increased from 0.2 volt to 12 volt. The V-R scanning result of the memory unit sample is illustrated in FIG. 8. The resistance of the memory unit is about several kilo-ohm at the READ region of the phase-change memory unit sample. The resistance of the memory unit decreases to 1/400 of the original one as the amplitude falls within the SET region (3.3 volt) of the lower margin. While the amplitude reaches the RESET region (>5 volt), the resistance of the memory unit returns back to high resistance. A cycling test is processed according to the SET/RESET margin as illustrated in FIG. 8, and the testing result shown in FIG. 9 represents that the sample has more than 200 times of cycling life.

It should be understood that the specification and examples described above are only representative of the principal and the effect of the present invention and has not attempted to limit the present invention. The scope for protecting the right of this invention should be as the following claims.

What is claimed is:

1. A phase-change material comprising a compound of a metal oxide or a metal nitroxide as a main component, wherein the metal is at least one selected from the group consisting of indium, gallium and germanium, wherein the phase-change material is in a single crystalline state, and wherein the compound of the metal oxide or metal nitroxide is represented by Formula (I):

in which a, b, c and d each represents a percentage of atomic number of each element in the Formula (I); and $0.15 < a < 0.65; 0 \leq b < 0.2; 0 \leq c < 0.4; 0.25 < d < 0.95$, wherein at least one of a, b and c is not 0, and $a+b+c+d \leq 1$.

2. The phase-change material of claim 1, further comprising a Group IV element.

3. The phase-change material of claim 1, which is formed by vapor deposition.

4. The phase-change material of claim 1, which is applicable to an electrical memory device.

5. A phase-change material comprising a compound of a metal oxide or a metal nitroxide as a main component, wherein the metal is at least one selected from the group consisting of indium, gallium and germanium, wherein the phase-change material is in a single crystalline state, and wherein the compound of the metal oxide or metal nitroxide is represented by Formula (I):

in which a, b, c and d each represents a percentage of atomic number of each element in the Formula (I), wherein $a:d = 2:3$, $0 \leq a < 1$, $b=0$, $c=0$, $0 < d < 1$, and $a+b+c+d < 1$.

6. A phase-change material comprising a compound of a metal oxide or a metal nitroxide as a main component, wherein the metal is at least one selected from the group consisting of indium, gallium and germanium, wherein the phase-change material is in a single crystalline, state, and wherein the compound of the metal oxide or metal nitroxide is represented by Formula (I):

in which a, b, c and d each represents a percentage of atomic number of each element in the Formula (I), wherein $a=0$, $0 \leq b < 0.2$, $c=0$, $0 < d < 1$ and $a+b+c+d=1$.

7. A phase-change material comprising a compound of a metal oxide or a metal nitroxide as a main component, wherein the metal is at least one selected from the group consisting of indium, gallium and germanium, wherein the phase-change material is in a single crystalline state, and wherein the compound of the metal oxide or metal nitroxide is represented by Formula (I):

in which a, b, c and d each represents a percentage of atomic number of each element in the Formula (I), wherein $a=0$, $0 \leq b < 0.2$, $c=0$, $0 < d < 1$ and $a+b+c+d < 1$.

8. A phase-change material, comprising a compound of a metal oxide or a metal nitroxide as a main component, wherein the metal is at least one selected from the group consisting of indium, gallium and germanium, wherein the phase-change material is in a single crystalline state, and wherein the crystalline state is a bixbyite cubic crystalline state.

9. A phase-change material, comprising a compound of a metal oxide or a metal nitroxide as a main component, wherein the metal is at least one selected from the group consisting of indium, gallium and germanium, wherein the phase-change material is in a single crystalline state, and wherein the phase-change temperature is between 275 and 290° C.

10. A phase-change memory unit, comprising:
a substrate;
at least a first contact electrode formed on the substrate;
a dielectric layer disposed on the substrate and formed with an opening for a layer of a phase-change material to be formed therein, wherein the layer of the phase-change material is electrically connected with the at least a first contact electrode, and comprises a compound of a metal oxide or a metal nitroxide as a main component, wherein the metal is at least one selected from the group consisting of indium, gallium and germanium, wherein the phase-change material is in a single crystalline state, and wherein the compound of the metal oxide or metal nitroxide is represented by Formula (I):

in which a, b, c and d each represents a percentage of atomic number of each element in the Formula (I); and 0.15<a<0.65; 0≦b<0.2; 0≦c <0.4; 0.25<d<0.95, wherein at least one of a, b and c is not 0, and a+b+c+d≦1; and at least a second contact electrode disposed on the dielectric layer and electrically connected with the layer of the phase-change material.

11. The phase-change memory unit of claim 10, wherein the layer of the phase-change material has a thickness of 5 to 100 nm.

12. The phase-change memory unit of claim 10, wherein a contact area between the layer of the phase-change material and the at least a first contact electrode is between 0.0003 and 100 μm².

13. The phase-change memory unit of claim 10, wherein the opening of the dielectric layer is between 22 and 180 nm in diameter.

14. The phase-change memory unit of claim 10, wherein the at least a first contact electrode and the at least a second contact electrode are made of a metallic material independently selected from the group consisting of Ti/Ni, Au, TiN, TiAlN, and alloy of Ti and W.

15. The phase-change memory unit of claim 10, wherein the dielectric layer is made of a material selected from the group consisting of $SiO_2$, SiO, $Ga_2O_3$, GaOOH, and $TiO_2$.

16. The phase-change memory unit of claim 10, further comprising a high-resistance heating electrode formed in the opening of the dielectric layer.

17. The phase-change memory unit of claim 16, wherein the high-resistance heating electrode is made of tungsten metal.

18. The phase-change memory unit of claim 10, which is applicable to an electrical memory device.

19. A method for electrically storing/reading data in/from a memory unit, comprising a use of a phase-change memory unit, wherein a voltage with pulse width between 10 and 150 ns is used for storing/reading the data, and wherein the phase-change memory unit comprises:

a substrate;

at least a first contact electrode formed on the substrate;

a dielectric layer disposed on the substrate and formed with an opening for a layer of a phase-change material to be formed therein, wherein the layer of the phase-change material is electrically connected with the at least a first contact electrode, and comprises a compound of a metal oxide or a metal nitroxide as a main component, wherein the metal is at least one selected from the group consisting of indium, gallium and germanium, wherein the phase-change material is in a single crystalline state, and wherein the compound of the metal oxide or metal nitroxide is represented by Formula (I):

$$In_aGa_bGe_cO_dN_{1-(a+b+c+d)} \quad (I)$$

in which a, b, c and d each represents a percentage of atomic number of each element in the Formula (I); and 0.15<a<0.65; 0≦b<0.2; 0≦c<0.4; 0.25<d<0.95, wherein at least one of a, b and c is not 0, and a+b+c+d≦1; and at least a second contact electrode disposed on the dielectric layer and electrically connected with the layer of the phase-change material.

20. A method for electrically storing/reading data in/from a memory unit, comprising a use of a phase-change memory unit, wherein a voltage with pulse amplitude between 0 and 15 volt is used for storing/reading the data, and wherein the phase-change memory unit comprises:

a substrate;

at least a first contact electrode formed on the substrate;

a dielectric disposed on the substrate and formed with an opening for a layer of a phase-change material to be formed therein, wherein the layer of the phase-change material is electrically connected with the at least a first contact electrode, and comprises a compound of a metal oxide or a metal nitroxide as a main component, wherein the metal is at least one selected from the group consisting of indium, gallium and germanium, wherein the phase-change material is in a single crystalline state, and wherein the compound of the metal oxide or metal nitroxide is represented by Formula (I):

$$In_aGa_bGe_cO_dN_{1-(a+b+c+d)} \quad (I)$$

in which a, b, c and d each represents a percentage of atomic number of each element in the Formula (I); and 0.15<a<0.65; 0≦b <0.2; 0≦c<0.4; 0.25<d<0.95, wherein at least one of a, b and c is not 0, and a+b+c+d≦1; and at least a second contact electrode disposed on the dielectric layer and electrically connected with the layer of the phase-change material.

* * * * *